(12) United States Patent
Shimizu

(10) Patent No.: US 10,381,491 B1
(45) Date of Patent: Aug. 13, 2019

(54) SEMICONDUCTOR DEVICE AND METHOD FOR FABRICATING THE SAME

(71) Applicant: Kabushiki Kaisha Toshiba, Minato-ku (JP)

(72) Inventor: Tatsuo Shimizu, Shinagawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 16/113,314

(22) Filed: Aug. 27, 2018

(30) Foreign Application Priority Data

Mar. 21, 2018 (JP) .................... 2018-053608

(51) Int. Cl.
*H01L 29/868* (2006.01)
*H01L 29/16* (2006.01)
(Continued)

(52) U.S. Cl.
CPC .......... *H01L 29/868* (2013.01); *H01L 21/046* (2013.01); *H01L 21/0485* (2013.01); *H01L 29/167* (2013.01); *H01L 29/1608* (2013.01); *H01L 29/36* (2013.01); *H01L 29/6606* (2013.01); *H01L 29/7803* (2013.01); *H01L 21/02378* (2013.01); *H01L 21/02529* (2013.01); *H01L 21/02634* (2013.01);
(Continued)

(58) Field of Classification Search
CPC ............... H01L 29/868; H01L 29/1608; H01L 29/7803; H01L 29/6606; H01L 21/0485; H01L 21/046; H01L 29/167; H01L 29/36
See application file for complete search history.

(56) References Cited

U.S. PATENT DOCUMENTS 8,367,507 B1 * 2/2013 Tsuchiya ............. H01L 29/7806
   438/299
9,324,826 B2 * 4/2016 Shimizu ............. H01L 29/66068
(Continued)

FOREIGN PATENT DOCUMENTS

| JP | 2014-078727 | 5/2014 |
| JP | 2015-146450 | 8/2015 |
| JP | 2016-063110 | 4/2016 |

OTHER PUBLICATIONS

Koutarou Kawahara, et al., "Detection and depth analyses of deep levels generated by ion implantation in n- and p-type 4H—SiC," Journal of Applied Physics 106, 2009, 7 Pages.

*Primary Examiner* — Earl N Taylor
(74) *Attorney, Agent, or Firm* — Oblon, McClelland, Maier & Neustadt, L.L.P.

(57) ABSTRACT

A semiconductor device according to an embodiment includes a first electrode; a second electrode; a silicon carbide layer disposed between the first electrode and the second electrode; an n-type silicon carbide region disposed in the silicon carbide layer and having a first nitrogen concentration; a first p-type silicon carbide region disposed in the silicon carbide layer between the n-type silicon carbide region and the first electrode and having a second nitrogen concentration higher than the first nitrogen concentration; and a second p-type silicon carbide region disposed in the silicon carbide layer between the first p-type silicon carbide region and the first electrode, having a third nitrogen concentration higher than the second nitrogen concentration, and having a p-type impurity concentration higher than that of the first p-type silicon carbide region.

15 Claims, 13 Drawing Sheets

(51) Int. Cl.
  *H01L 29/36*   (2006.01)
  *H01L 29/167*  (2006.01)
  *H01L 21/04*   (2006.01)
  *H01L 29/66*   (2006.01)
  *H01L 29/78*   (2006.01)
  *H01L 29/04*       (2006.01)
  *H01L 29/45*       (2006.01)
  *H01L 21/02*       (2006.01)
  *H01L 29/08*       (2006.01)
  *H01L 29/10*       (2006.01)
  *H01L 29/49*       (2006.01)

(52) U.S. Cl.
  CPC ........ *H01L 21/049* (2013.01); *H01L 21/0475* (2013.01); *H01L 29/045* (2013.01); *H01L 29/086* (2013.01); *H01L 29/0878* (2013.01); *H01L 29/1095* (2013.01); *H01L 29/45* (2013.01); *H01L 29/4916* (2013.01); *H01L 29/66068* (2013.01)

(56) References Cited

U.S. PATENT DOCUMENTS

| | | | |
|---|---|---|---|
| 9,559,172 B2* | 1/2017 | Shimizu | H01L 29/6606 |
| 9,716,186 B2* | 7/2017 | Nishio | H01L 29/8611 |
| 2005/0229965 A1* | 10/2005 | Nishimura | H01L 31/075 |
| | | | 136/255 |
| 2010/0065843 A1* | 3/2010 | Kyotani | H01L 33/0095 |
| | | | 257/43 |
| 2010/0258796 A1* | 10/2010 | Horio | H01L 33/28 |
| | | | 257/43 |
| 2012/0161224 A1* | 6/2012 | Eckel | H01L 27/0629 |
| | | | 257/328 |
| 2012/0199846 A1* | 8/2012 | Shimizu | H01L 29/66068 |
| | | | 257/77 |
| 2014/0284619 A1* | 9/2014 | Nishio | H01L 29/1608 |
| | | | 257/77 |
| 2014/0284621 A1* | 9/2014 | Shimizu | H01L 29/1608 |
| | | | 257/77 |
| 2014/0284622 A1* | 9/2014 | Shimizu | H01L 29/6606 |
| | | | 257/77 |
| 2015/0087125 A1* | 3/2015 | Nishio | H01L 21/02636 |
| | | | 438/285 |
| 2015/0214306 A1* | 7/2015 | Kojima | H01L 21/02378 |
| | | | 257/77 |
| 2016/0087043 A1* | 3/2016 | Shimizu | H01L 29/1608 |
| | | | 257/77 |
| 2016/0087044 A1* | 3/2016 | Iijima | H01L 29/1095 |
| | | | 257/77 |
| 2016/0149056 A1* | 5/2016 | Nishio | H01L 29/8611 |
| | | | 257/77 |
| 2016/0197155 A1* | 7/2016 | Hiyoshi | H01L 21/02008 |
| | | | 257/77 |
| 2017/0179235 A1* | 6/2017 | Kinoshita | H01L 29/6606 |
| 2018/0197983 A1* | 7/2018 | Kinoshita | H01L 29/78 |
| 2018/0315842 A1* | 11/2018 | Tawara | H01L 21/02378 |
| 2018/0366574 A1* | 12/2018 | Ohse | H01L 29/7811 |
| 2018/0374918 A1* | 12/2018 | Nishio | H01L 29/0619 |
| 2019/0103462 A1* | 4/2019 | Matsunaga | H01L 29/1608 |

* cited by examiner

SEMICONDUCTOR DEVICE AND METHOD FOR FABRICATING THE SAME

CROSS-REFERENCE TO RELATED APPLICATION

This application is based upon and claims the benefit of priority from Japanese Patent Application No. 2018-053608, filed on Mar. 21, 2018, the entire contents of which are incorporated herein by reference.

FIELD

Embodiments described herein relate generally to a semiconductor device and a method for fabricating the semiconductor device.

BACKGROUND

Silicon carbide (SiC) is expected as a material for next generation semiconductor devices. As compared with silicon (Si), silicon carbide has excellent properties such as a band gap of about three times, a breakdown field strength of about 10 times, and thermal conductivity of about three times. By utilizing such properties, a semiconductor device capable of operating with low loss at high temperature can be implemented. However, for example, when a PiN diode is formed using silicon carbide, there is a problem that the on-resistance is high.

Figure 13:
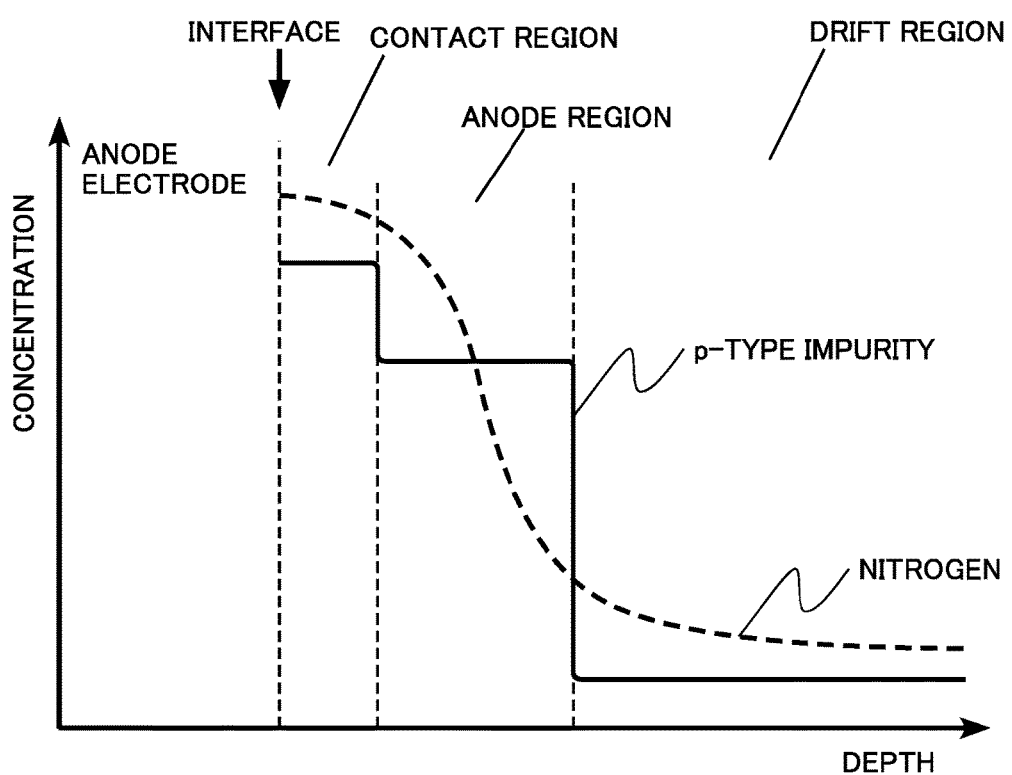
Figure 14:
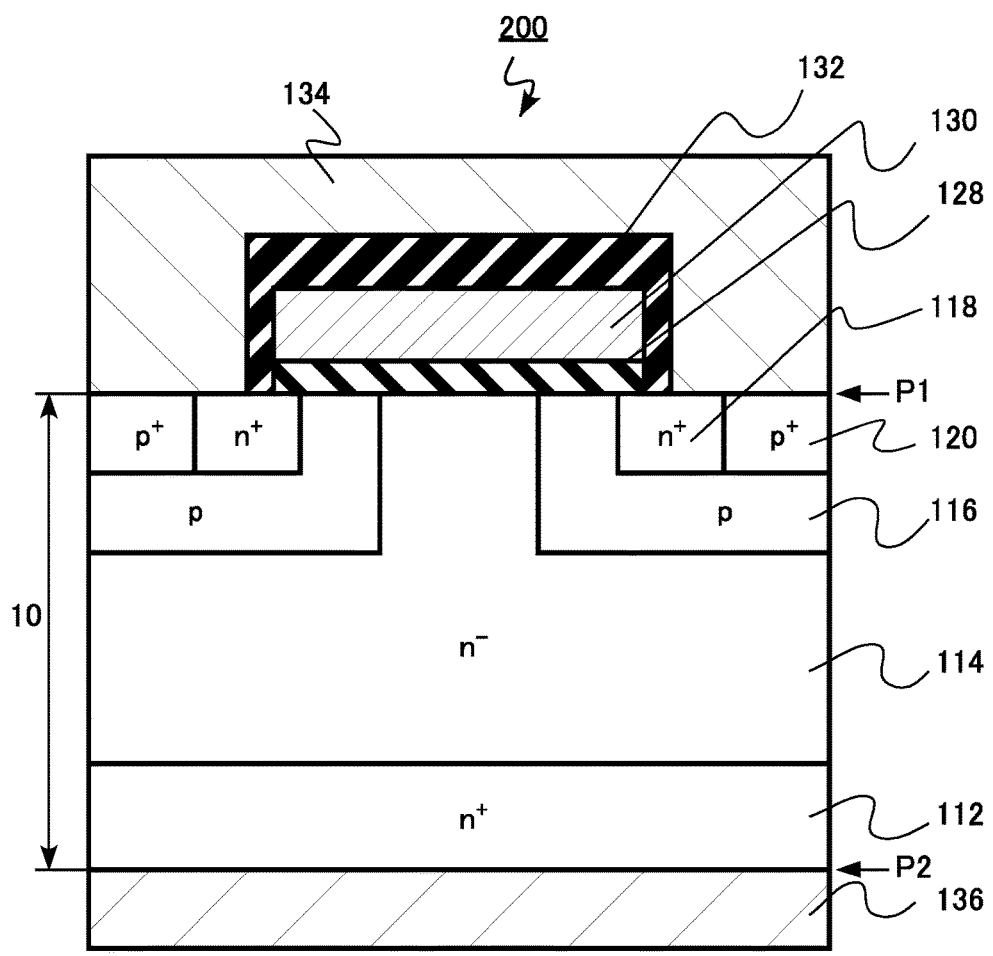

12A and 12B are explanatory views of the functions of the semiconductor device according to the first embodiment and the method for fabricating the semiconductor device;

FIG. 13 is a diagram showing the concentration distribution of elements in a modification of the semiconductor device according to the first embodiment; and FIG. 14 is a schematic sectional view of a semiconductor device according to a second embodiment.

DETAILED DESCRIPTION

A semiconductor device according to an embodiment includes a first electrode; a second electrode; a silicon carbide layer disposed between the first electrode and the second electrode; an n-type silicon carbide region disposed in the silicon carbide layer and having a first nitrogen concentration; a first p-type silicon carbide region disposed in the silicon carbide layer between the n-type silicon carbide region and the first electrode and having a second nitrogen concentration higher than the first nitrogen concentration; and a second p-type silicon carbide region disposed in the silicon carbide layer between the first p-type silicon carbide region and the first electrode, having a third nitrogen concentration higher than the second nitrogen concentration, and having a p-type impurity concentration higher than a p-type impurity concentration of the first p-type silicon carbide region.

Hereinafter, embodiments of the present disclosure will be described with reference to the drawings. In the description that follows, the same or similar members and the like are denoted by the same reference signs, and the description of the members and the like once described is omitted as appropriate.

Also in the description that follows, the notations $n^+$, n, and $n^-$ and $p^+$, p, and $p^-$ represent the relative level of impurity concentration of each conductivity type. That is, $n^+$ indicates to have a relatively higher impurity concentration of n-type than n, and $n^-$ indicates to have a relatively lower impurity concentration of n-type than n. In addition, $p^+$ indicates to have a relatively higher impurity concentration of p-type than p, and $p^-$ indicates to have a relatively lower impurity concentration of p-type than p. Note that the $n^+$ type and the $n^-$ type may be simply described as the n-type, the $p^+$ type and the $p^-$ type simply as the p-type.

First Embodiment

A semiconductor device according to a first embodiment includes a first electrode, a second electrode, a silicon carbide layer disposed between the first electrode and the second electrode, an n-type silicon carbide region disposed in the silicon carbide layer and having a first nitrogen concentration, a first p-type silicon carbide region disposed in the silicon carbide layer between the n-type silicon carbide region and the first electrode and having a second nitrogen concentration higher than the first nitrogen concentration, and a second p-type silicon carbide region disposed in the silicon carbide layer between the first p-type silicon carbide region and the first electrode, having a third nitrogen concentration higher than the second nitrogen concentration, and having a p-type impurity concentration higher than that of the first p-type silicon carbide region.

Figure 1:
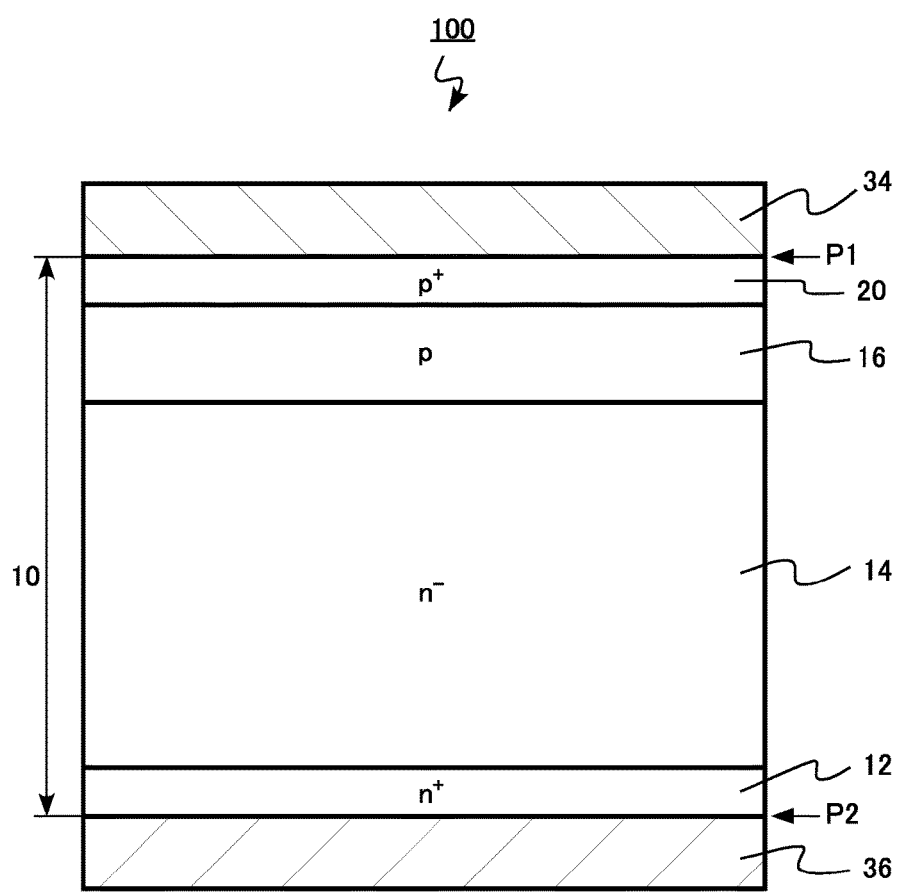
FIG. 1 is a schematic sectional view of a semiconductor device according to a first embodiment.

FIG. 1 is a schematic sectional view of a semiconductor device according to the first embodiment. The semiconductor device according to the first embodiment is a PiN diode 100.

The PiN diode 100 includes a silicon carbide layer 10, a cathode region 12, a drift region 14 (n-type silicon carbide region), an anode region 16 (first p-type silicon carbide region), a contact region 20 (second p-type silicon carbide region), an anode electrode 34 (first electrode), and a cathode electrode 36 (second electrode). The cathode region 12, the drift region 14, the anode region 16, and the contact region 20 are disposed in the silicon carbide layer 10.

The silicon carbide layer 10 is single crystal SiC. The silicon carbide layer 10 is, for example, 4H—SiC.

Figure 2:
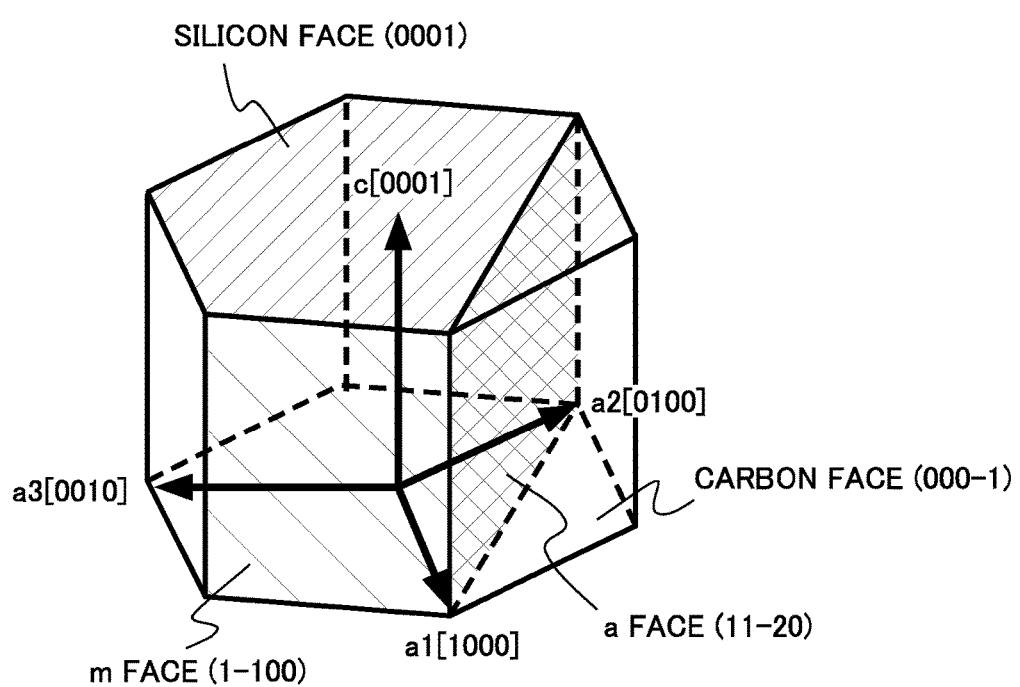
FIG. 2 is a diagram showing a crystal structure of a silicon carbide semiconductor according to the first embodiment.

FIG. 2 is a diagram showing a crystal structure of a silicon carbide semiconductor. A typical crystal structure of a silicon carbide semiconductor is a hexagonal crystal system such as 4H-SiC. One of faces to which a c-axis along the axial direction of a hexagonal prism (top faces of a hexagonal prism) is normal is a (0001) face. A face equivalent to the (0001) face is referred to as a silicon face and is denoted as a {0001} face. Silicon (Si) is arranged on the silicon face.

The other of faces to which the c-axis along the axial direction of a hexagonal prism (top faces of a hexagonal prism) is normal a (000-1) face. A face equivalent to the (000-1) face is referred to as a carbon face and is denoted as a {000-1} face. Carbon (C) is arranged on the carbon face.

On the other hand, a side face (prismatic face) of the hexagonal prism is an m face, which is a face equivalent to a (1-100) face, that is, a {1-100} face. Also, a face passing through a pair of ridgelines not adjacent to each other is an a face, which is a face equivalent to a (11-20) face, that is, a {11-20} face. Both silicon (Si) and carbon (C) are arranged on the m face and the a face.

The silicon carbide layer 10 has a first plane P1 (front surface) and a second plane P2 (rear surface). The front surface P1 of the silicon carbide layer 10 is, for example, a face inclined at 0° to 8° with respect to the (0001) face. The (0001) face is called a silicon face. The rear surface P2 of the silicon carbide layer 10 is, for example, a face inclined at 0° to 8° with respect to the (000-1) face.

The silicon carbide layer 10 is disposed between the anode electrode 34 (first electrode) and the cathode electrode 36 (second electrode).

Figure 3:
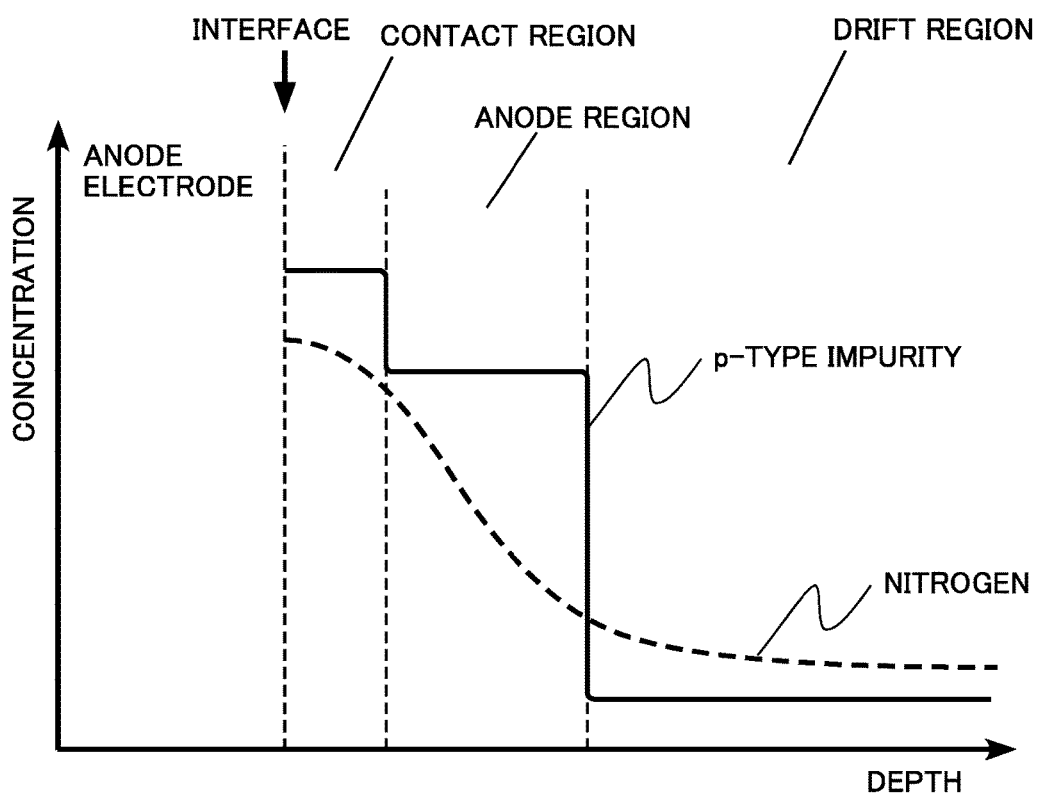
FIG. 3 is a diagram showing a concentration distribution of elements of a semiconductor device according to the first embodiment.

FIG. 3 is a diagram showing the concentration distribution of elements in the semiconductor device according to the first embodiment. FIG. 3 shows the concentration distribution of nitrogen and p-type impurities in a cross section including the silicon carbide layer 10 and the anode electrode 34.

The cathode region 12 is, for example, n$^+$-type SiC. The cathode region 12 contains, for example, nitrogen (N) as an n-type impurity. The impurity concentration of the n-type impurity in the cathode region 12 is, for example, $1 \times 10^{18}$ cm$^{-3}$ or more and $1 \times 10^{21}$ cm$^{-3}$ or less.

The drift region 14 is disposed on the cathode region 12. The drift region 14 is n$^-$-type SiC. The drift region 14 contains, for example, nitrogen as an n-type impurity.

The impurity concentration of the n-type impurity in the drift region 14 is lower than that of the n-type impurity in the cathode region 12. The impurity concentration of the n-type impurity in the drift region 14 is, for example, $1 \times 10^{-15}$ cm$^{-3}$ or more and $2 \times 10^{16}$ cm$^{-3}$ or less.

The drift region 14 is, for example, an epitaxial growth layer of SiC formed by epitaxial growth on the cathode region 12. The thickness of the drift region 14 is, for example, 5 μm or more and 100 μm or less.

The drift region 14 has a first nitrogen concentration. The first nitrogen concentration is a concentration including nitrogen that does not function as a dopant. The first nitrogen concentration is a concentration including inert nitrogen. The first nitrogen concentration is, for example, $1 \times 10^{15}$ cm$^{-3}$ or more and $2 \times 10^{16}$ cm$^{-3}$ or less.

Figure 4:
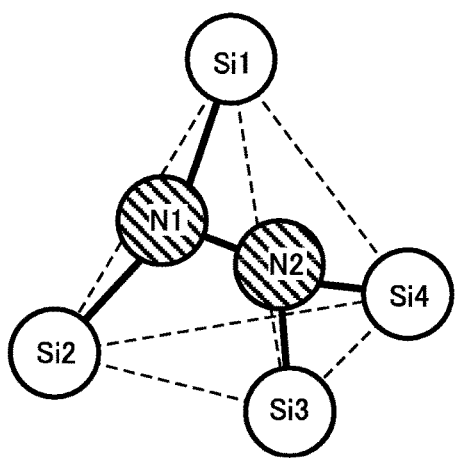
FIG. 4 is an explanatory view of the semiconductor device according to the first embodiment.

FIG. 4 is an explanatory view of the semiconductor device according to the first embodiment. The drift region 14 has a structure in which, as shown in FIG. 4, two nitrogen atoms are present at a carbon position of the silicon carbide crystal lattice. In other words, the drift region 14 has a structure in which two nitrogen atoms are contained in a carbon vacancy Vc of the silicon carbide crystal lattice. Hereinafter, this structure is referred to as a VcNN structure.

As shown in FIG. 4, the VcNN structure has a first nitrogen atom N1 bonded to two silicon atoms Si1 and Si2 and a second nitrogen atom N2 bonded to the first nitrogen atom N1 and also bonded to two silicon atoms Si3 and Si4.

Nitrogen in the VcNN structure does not function as a dopant. Nitrogen in the VcNN structure is inert nitrogen.

The drift region 14 has the density of the carbon vacancies Vc reduced by including the VcNN structure. The VcNN structure is particularly contained in the vicinity of the anode region 16 of the drift region 14.

The anode region 16 is disposed between the drift region 14 and the anode electrode 34. The anode region 16 is disposed on the front surface of the drift region 14. The anode region 16 is p-type SiC. The anode region 16 contains, for example, aluminum (Al) as a p-type impurity. The impurity concentration of the p-type impurity in the anode region 16 is, for example, $1 \times 10^{16}$ cm$^{-3}$ or more and $1 \times 10^{18}$ cm$^{-3}$ or less.

The depth of the anode region 16 is, for example, 0.5 μm or more and 2.0 μm or less. The front surface of the anode region 16 is a face inclined at 0° to 8° with respect to the silicon face.

The anode region 16 has a second nitrogen concentration. The second nitrogen concentration is higher than the first nitrogen concentration. The second nitrogen concentration is a concentration including nitrogen that does not function as a dopant. The second nitrogen concentration is a concentration including inert nitrogen. The second nitrogen concentration is, for example, $1 \times 10^{16}$ cm$^{-3}$ or more and $1 \times 10^{19}$ cm$^{-3}$ or less.

The anode region 16 has a VcNN structure. The density of the VcNN structure in the anode region 16 is higher than that of the VcNN structure in the drift region 14.

The contact region 20 is disposed between the anode region 16 and the anode electrode 34. The contact region 20 is disposed on the front surface of the anode region 16. The contact region 20 is p$^+$-type SiC.

The contact region 20 contains, for example, aluminum as a p-type impurity. The impurity concentration of the p-type impurity in the contact region 20 is higher than that of the p-type impurity in the anode region 16. The impurity concentration of the p-type impurity in the contact region 20 is, for example, $1 \times 10^{19}$ cm$^{-3}$ or more and $1 \times 10^{22}$ cm$^{-3}$ or less.

The depth of the contact region 20 is shallower than that of the anode region 16. The depth of the contact region 20 is, for example, 0.1 μm or more and 0.3 μm or less.

The contact region 20 has a third nitrogen concentration. The third nitrogen concentration is higher than the second nitrogen concentration. The third nitrogen concentration is a concentration including nitrogen that does not function as a dopant. The third nitrogen concentration is a concentration including inert nitrogen. The third nitrogen concentration is, for example, $1 \times 10^{18}$ cm$^{-3}$ or more and $5 \times 10^{22}$ cm$^{-3}$ or less.

The contact region 20 has a VcNN structure. The density of the VcNN structure in the contact region 20 is higher than that of the VcNN structure in the anode region 16.

The anode electrode 34 is electrically connected to the contact region 20. The anode electrode 34 is disposed on the side of the front surface P1 of the silicon carbide layer 10. The anode electrode 34 is in contact with the silicon carbide layer 10.

The anode electrode 34 is, for example, a metal or a metal compound. The anode electrode 34 is constructed of a lamination of, for example, a barrier metal layer of Ni (nickel) and a metal layer of aluminum on the barrier metal layer. The barrier metal layer of nickel and the silicon carbide layer 10 may react to form nickel silicide (NiSi, $Ni_2Si$, etc.). The barrier metal layer of nickel and the metal layer of aluminum may form an alloy by reaction.

The cathode electrode 36 is electrically connected to the cathode region 12. The cathode electrode 36 is disposed on the side of the rear surface P2 of the silicon carbide layer 10. The cathode electrode 36 is in contact with the silicon carbide layer 10.

The cathode electrode 36 is, for example, a metal or a metal compound. The cathode electrode 36 is, for example, nickel. Nickel may react with the silicon carbide layer 10 to form nickel silicide (NiSi, $Ni_2Si$, etc.).

In the first embodiment, the n-type impurity is preferably, for example, nitrogen (N) or phosphorus (P), but arsenic (As) or antimony (Sb) may also be applied. The p-type impurity is preferably, for example, aluminum (Al), but boron (B), gallium (Ga), or indium (In) may also be applied.

The bonding state of nitrogen in the silicon carbide layer 10 and the position of nitrogen in the silicon carbide crystal lattice can be determined by, for example, X-ray photoelectron spectroscopy (XPS). The level of density of the VcNN structure in the silicon carbide layer 10 can be determined by comparing the peak intensity of XPS. The distribution of nitrogen and p-type impurities in the silicon carbide layer 10 can be measured by, for example, secondary ion mass spectrometry (SIMS). Whether the region in the silicon carbide layer 10 is p-type or n-type can be determined by, for example, scanning capacitance microscopy (SCM).

Next, a method of fabricating a semiconductor device according to the first embodiment will be described.

A method for fabricating a semiconductor device according to the first embodiment includes forming a first p-type silicon carbide region by performing a first ion implantation of a p-type impurity from a side of a first plane into a silicon carbide layer having the first plane and a second plane, forming a second p-type silicon carbide region having a higher p-type impurity concentration than the first p-type silicon carbide region and which is shallower than the first p-type silicon carbide region by performing a second ion implantation of the p-type impurity from the side of the first plane into the silicon carbide layer, performing first heat treatment at 1650° C. or more and 1900° C. or less, performing second heat treatment at 1300° C. or more and 1500° C. or less in an $N_2$ gas having an oxygen partial pressure of 0.1 ppm or less in a state where the first plane is exposed, forming a first electrode on the first plane, and forming a second electrode on the second plane.

FIGS. 5, 6, 7, 8, and 9 are schematic sectional views showing the semiconductor device in the process of fabrication by the method for fabricating the semiconductor device according to the first embodiment.

Figure 5:
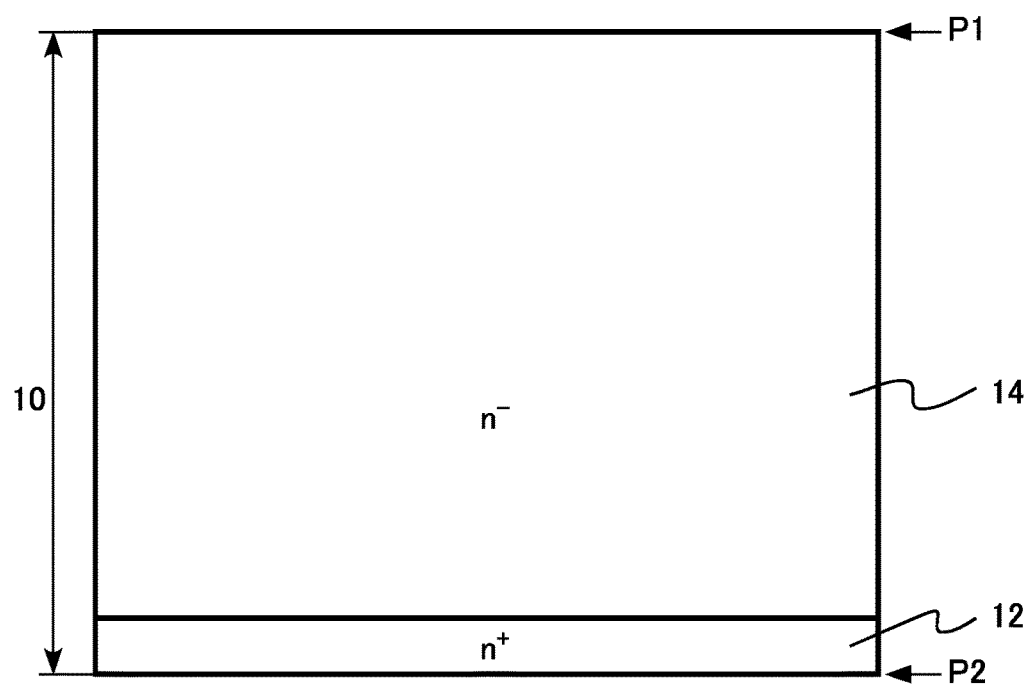
FIG. 5 is a schematic sectional view showing a semiconductor device in the process of fabrication by a method for fabricating the semiconductor device according to the first embodiment.

First, an $n^+$-type silicon carbide substrate having the first plane P1 (front surface) as a silicon face and the second plane P2 (rear surface) as a carbon face is prepared. The silicon carbide substrate corresponds to the cathode region 12 of the silicon carbide layer 10. Next, the drift region 14 of $n^-$-type is formed on the silicon carbide substrate by epitaxial growth (FIG. 5).

Figure 6:
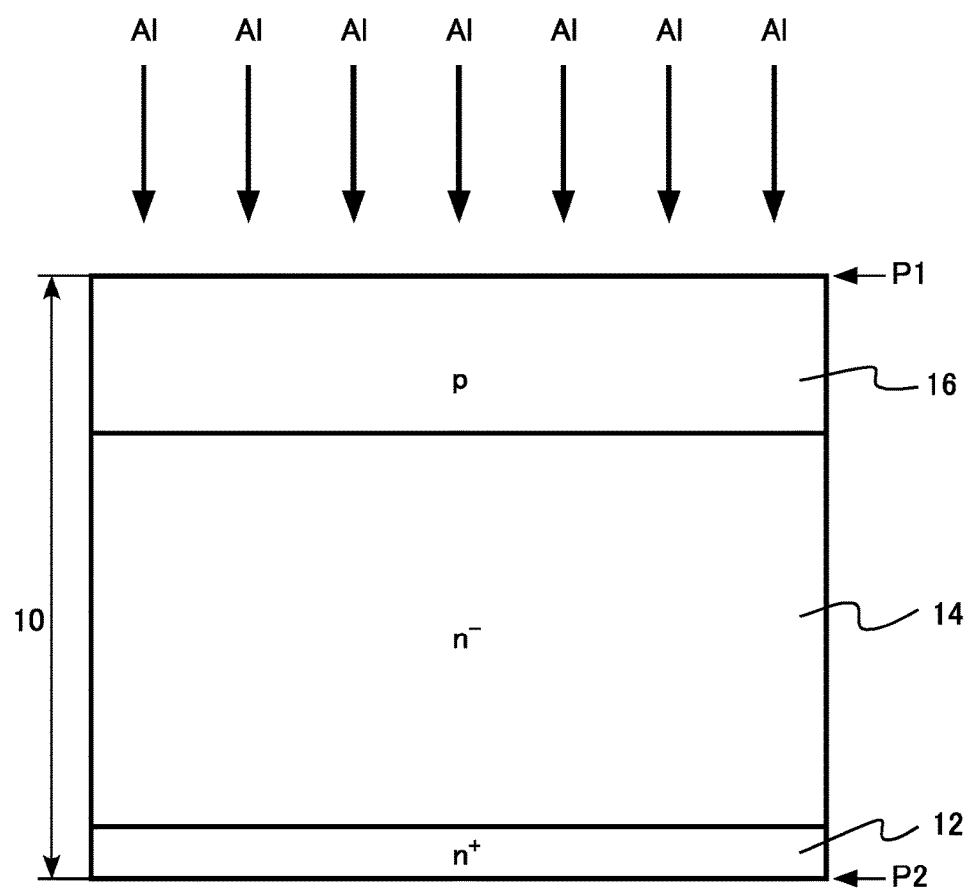
FIG. 6 is a schematic sectional view showing the semiconductor device in the process of fabrication by the method for fabricating the semiconductor device according to the first embodiment.

Next, the anode region 16 of p-type is formed by a known ion implantation method (FIG. 6). First ion implantation of a p-type impurity is performed from the side of the front surface P1 of the silicon carbide layer 10. The p-type impurity is, for example, aluminum (Al).

Figure 7:
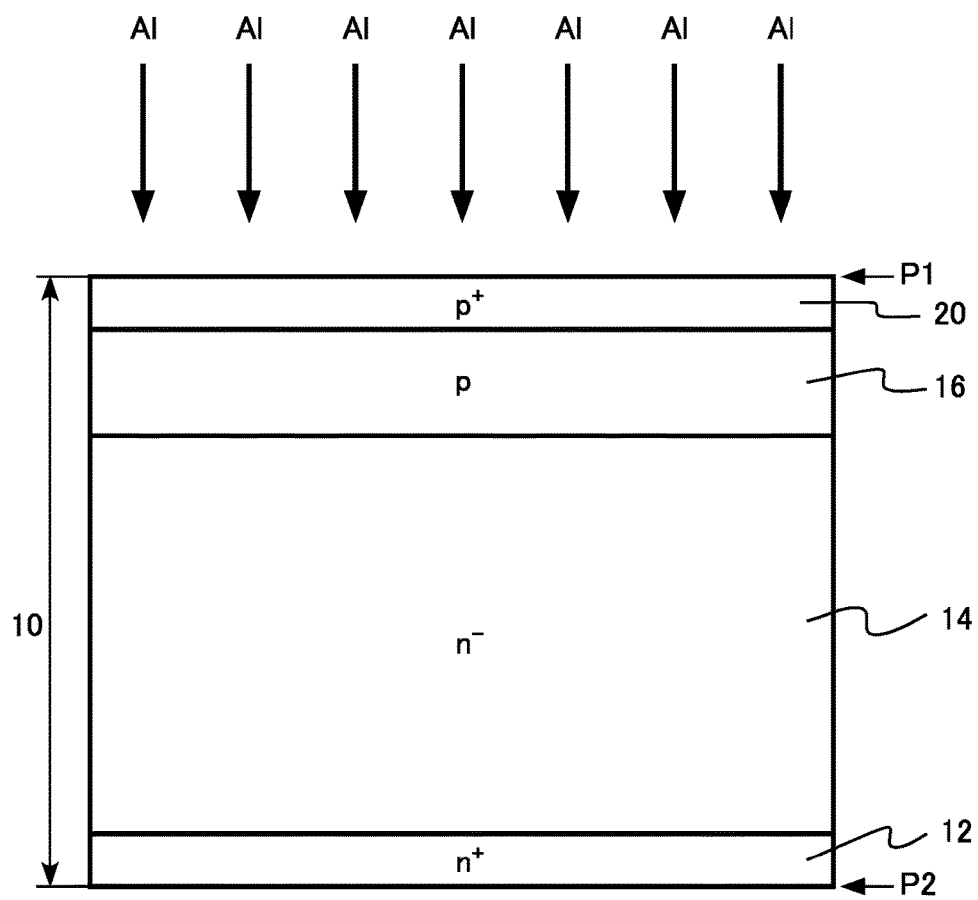
FIG. 7 is a schematic sectional view showing the semiconductor device in the process of fabrication by the method for fabricating the semiconductor device according to the first embodiment.

Next, the contact region 20 of $p^+$-type is formed by a known ion implantation method (FIG. 7). Second ion implantation of a p-type impurity is performed from the side of the front surface P1 of the silicon carbide layer 10. The p-type impurity is, for example, aluminum (Al).

The p-type impurity concentration of the contact region 20 is higher than that of the anode region 16. Further, the depth of the contact region 20 is shallower than that of the anode region 16.

Figure 8:
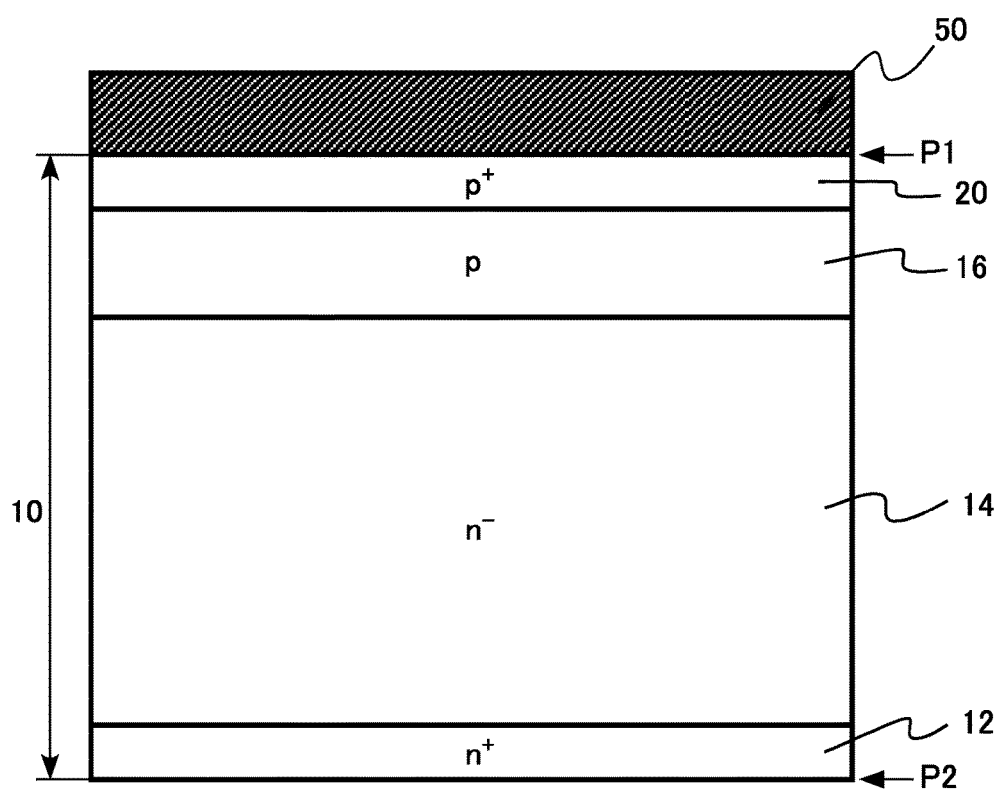
FIG. 8 is a schematic sectional view showing the semiconductor device in the process of fabrication by the method for fabricating the semiconductor device according to the first embodiment.

Next, a carbon film 50 is deposited on the front surface P1 of the silicon carbide layer 10. Next, first heat treatment at 1650° C. or more and 1900° C. or less is performed (FIG. 8). The carbon film 50 prevents silicon from being detached from the front surface P1 of the silicon carbide layer 10 during the first heat treatment at high temperature.

P-type impurities in the anode region 16 and the contact region 20 are activated by the first heat treatment. The first heat treatment is performed in, for example, an argon atmosphere.

Next, the carbon film 50 is removed. Then, for example, a surface film (not shown) on the front surface P1 of the silicon carbide layer 10 is removed by wet etching. The surface film is a film containing oxygen. The surface film is, for example, an oxide film formed by residual oxygen during the first heat treatment.

Figure 9:
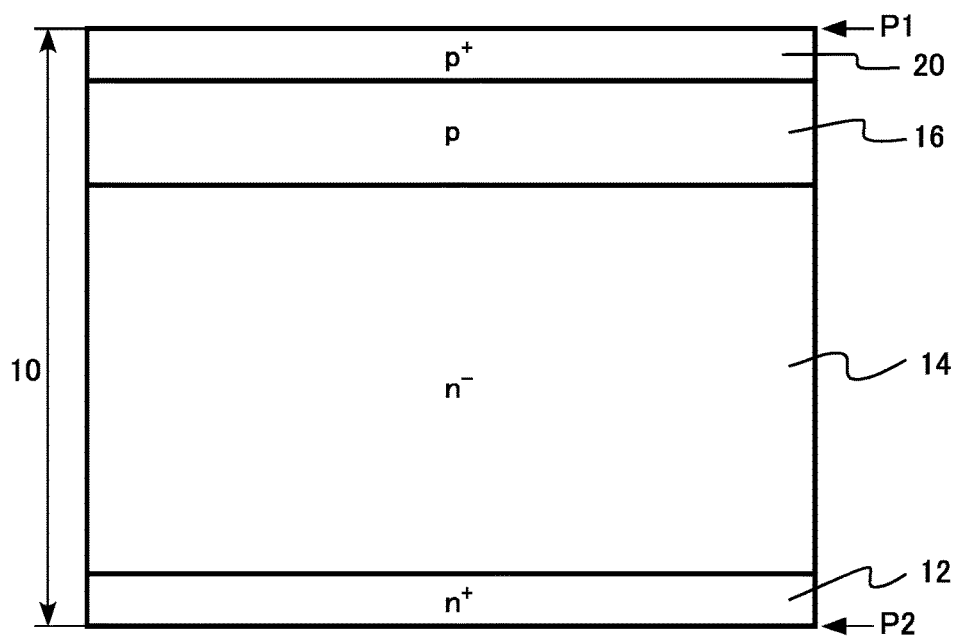
FIG. 9 is a schematic sectional view showing the semiconductor device in the process of fabrication by the method for fabricating the semiconductor device according to the first embodiment.

Next, second heat treatment at 1300° C. or more and 1500° C. or less is performed on the silicon carbide layer 10 where the front surface P1 is exposed in an $N_2$ gas having an oxygen partial pressure of 0.1 ppm or less (FIG. 9). A VcNN structure is formed in the silicon carbide layer 10 by the second heat treatment.

Then, the anode electrode 34 and the cathode electrode 36 are formed by a known process to fabricate the PiN diode 100 according to the first embodiment shown in FIG. 1.

Hereinafter, functions and effects of the semiconductor device according to the first embodiment and the method for fabricating the semiconductor device will be described.

When the PiN diode 100 is formed using silicon carbide, there is a problem that the on-resistance is high. One of the reasons why the on-resistance is high is considered to be the presence of carbon vacancies Vc in the silicon carbide layer 10. The carbon vacancy Vc is considered to be formed by, for example, damage caused by ion implantation of a p-type impurity when the anode region 16 or the contact region 20 is formed.

The PiN diode 100 according to the first embodiment has a VcNN structure in the silicon carbide layer 10. By including the VcNN structure, the density of the carbon vacancies Vc in the silicon carbide layer 10 is reduced. Thus, the on-resistance of the PiN diode 100 is reduced. Details will be described below.

Figure 10A:
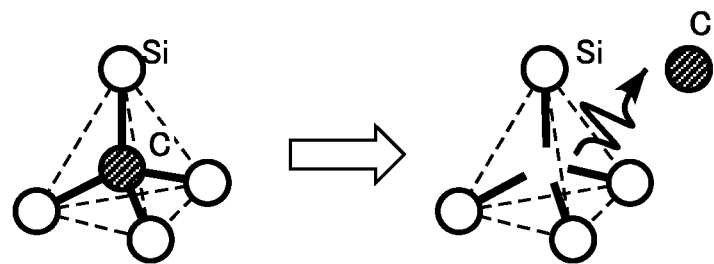
FIGS. 10A, 10B, and 10C are explanatory views of functions of the semiconductor device according to the first embodiment and the method for fabricating the semiconductor device.
Figure 10B:
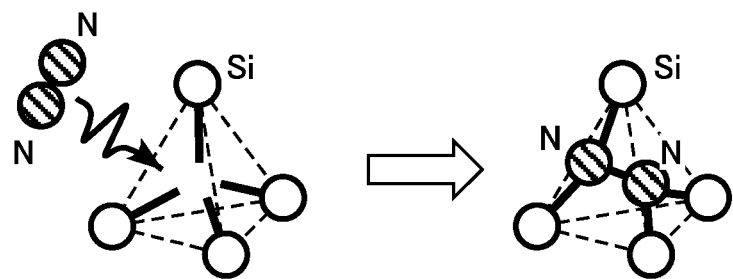
Figure 10C:
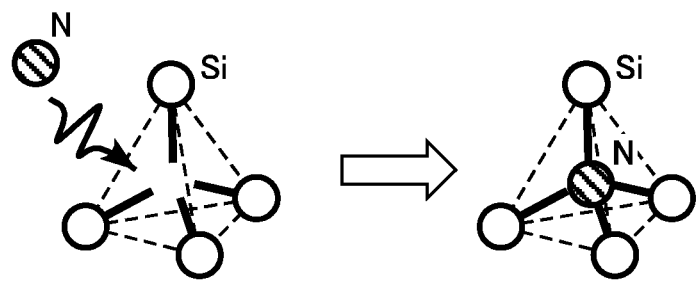

FIGS. 10A, 10B, and 10C are explanatory views of the functions of the semiconductor device according to the first embodiment and the method for fabricating the semiconductor device. FIG. 10A is an explanatory view of the carbon vacancy Vc, FIG. 10B is an explanatory view of the VcNN structure, and FIG. 10C is an explanatory view of a VcN structure. The VcN structure is a structure in which one nitrogen atom is contained in the carbon vacancy Vc of the silicon carbide crystal lattice.

For example, when a p-type impurity is ion-implanted from the front surface of the silicon carbide layer 10, carbon in the silicon carbide crystal lattice is desorbed by the kinetic energy of the p-type impurity. As a result, the carbon vacancy Vc is formed (FIG. 10A).

As a result of the first principle calculation, it became clear that the VcNN structure containing two nitrogen atoms in the carbon vacancies Vc can exist in a stable manner. Then, in order to form a VcNN structure, it also became clear that $N_2$ molecules in an excited state are desirably supplied to the silicon carbide layer 10 where the carbon vacancies Vc are present (FIG. 10B). That is, it became clear that a VcNN structure can be formed from a state where a pair of nitrogen atoms in an excited state coexist with the carbon vacancy Vc. More specifically, a VcNN structure is formed by performing heat treatment in a high-temperature $N_2$ gas atmosphere.

For example, in nitrogen plasma treatment, nitrogen is excited as an atom and thus, a VcNN structure is not formed and a VcN structure is formed (FIG. 10C).

Figure 11:
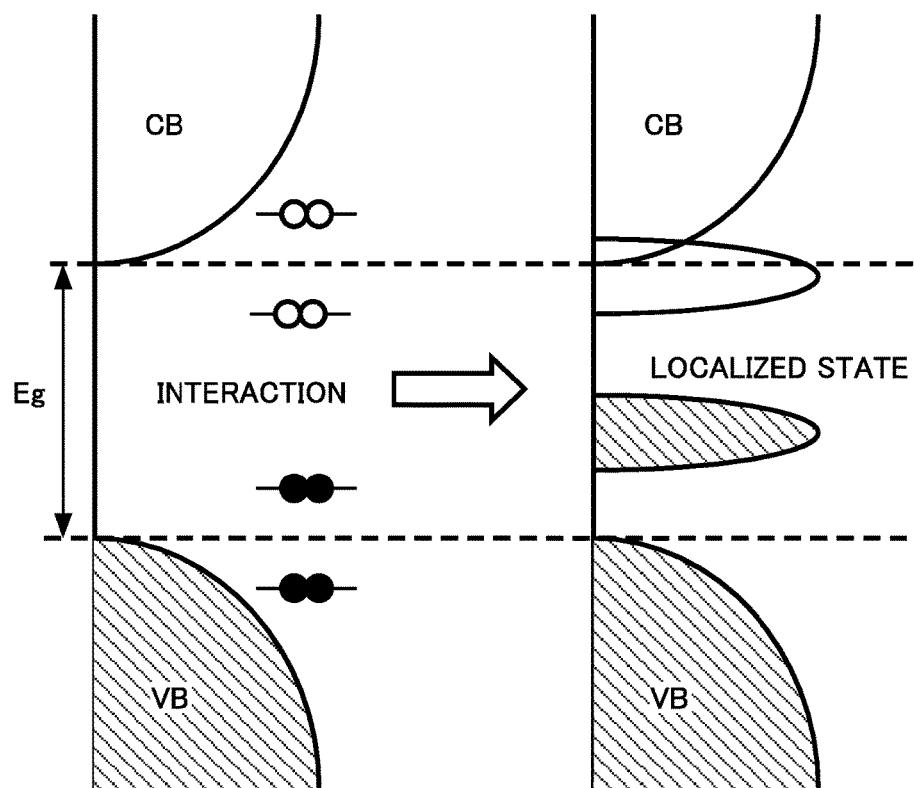
FIG. 11 is an explanatory view of the function of the semiconductor device according to the first embodiment and the method for fabricating the semiconductor device.

FIG. 11 is an explanatory view of the functions of the semiconductor device according to the first embodiment and the method for fabricating the semiconductor device. FIG. 11 is an explanatory view of an electronic state of the carbon vacancy Vc. FIG. 11 shows a band diagram of silicon carbide when the carbon vacancy Vc is present.

Four silicon dangling bonds are formed by the carbon vacancy Vc and, as shown in the left diagram of FIG. 11, each bond forms an energy level. The black circle indicates a state in which the energy level is filled with electrons, and the open circle indicates a state in which the energy level is not filled with electrons. As the respective energy levels interact, as shown in the right diagram, localized states are formed in the band gap and at the lower end of the conduction band CB.

The localized state at the lower end of the conduction band CB acts as a trap of electrons. Thus, Fermi level pinning occurs and the barrier of carriers between the anode electrode 34 and the contact region 20 increases. Therefore, there is a possibility that the contact resistance of the anode electrode 34 increases. With an increased contact resistance of the anode electrode 34, the on-resistance of the PiN diode 100 increases. The barrier for hole injection is formed and thus, the hole injection efficiency drops greatly. Also, the extraction efficiency of holes decreases and thus, the bipolar operation speed decreases and the switching loss increases.

The localized state in the band gap acts as a hole trap. Thus, the lifetime of holes is shortened. In particular, if the carbon vacancy Vc is present in the drift region 14, the lifetime of the hole is shortened so that the conductivity modulation becomes ineffective and the on-resistance of the PiN diode 100 is increased.

Figure 12A:
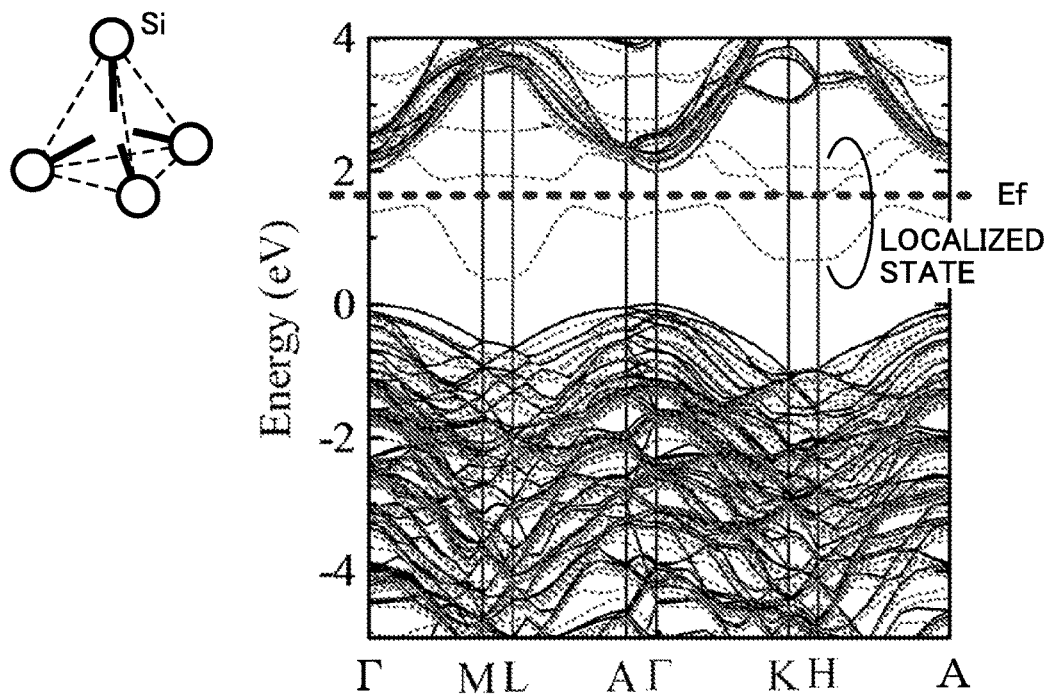
Figure 12B:
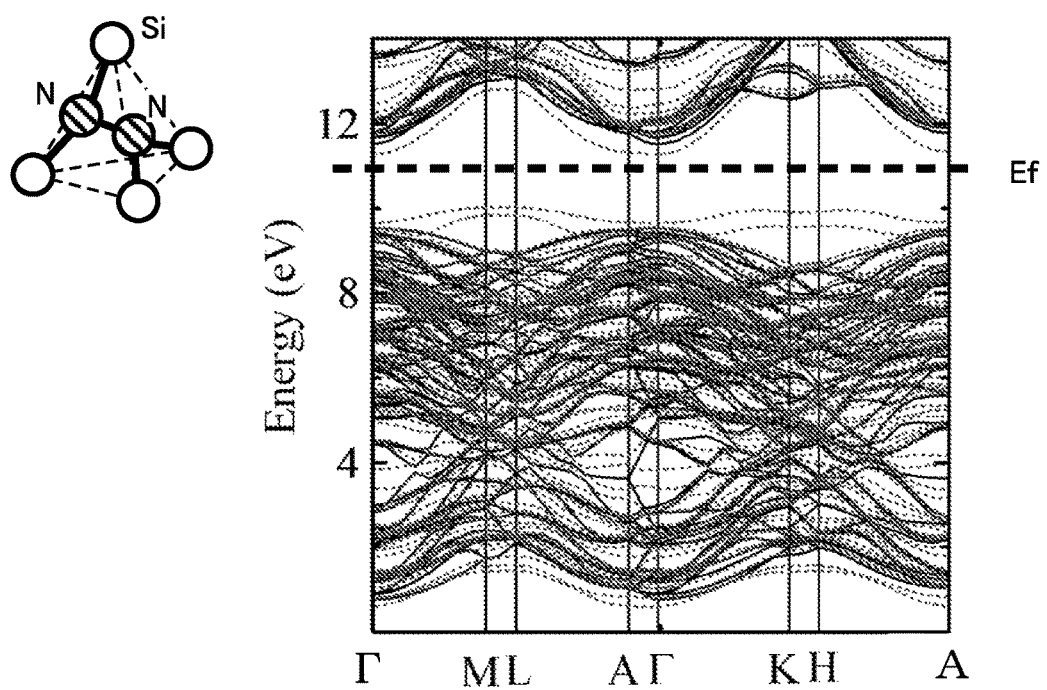

FIGS. 12A and 12B are explanatory views of the functions of the semiconductor device according to the first embodiment and the method for fabricating the semiconductor device. FIG. 12A is a band diagram when the carbon vacancy Vc is present in the silicon carbide crystal lattice, and FIG. 12B is a band diagram when there is a VcNN structure in the silicon carbide crystal lattice. FIGS. 12A and 12B are simulation results.

As shown in FIG. 12A, when the carbon vacancy Vc is present, it is clear that localized states are formed in the middle of the band gap and at the lower end of the conduction band CB. In contrast, when there is a VcNN structure, as shown in FIG. 12B, the localized state disappears.

With the VcNN structure being formed, the carbon vacancy Vc disappears and the localized states in the band gap and at the lower end of the conduction band CB disappear. Thus, the contact resistance of the anode electrode 34 is reduced. In addition, the lifetime of holes is prolonged and conductivity modulation functions effectively. Therefore, the PiN diode 100 with low on-resistance is implemented.

When, instead of the VcNN structure, the VcN structure shown in FIG. 10C is formed, the VcN structure acts as a donor. Thus, the diffusion layer resistance of the anode region 16 and the contact region 20 is increased. Therefore, there arises a problem that the on-resistance of the PiN diode 100 increases.

The third nitrogen concentration in the contact region 20 is preferably, for example, $1\times10^{18}$ cm$^{-3}$ or more and $5\times10^{22}$ cm$^{-3}$ or less. Below the above range, the contact resistance may not decrease sufficiently. Also, exceeding the above range is difficult to achieve in terms of fabrication.

The second nitrogen concentration in the anode region 16 is preferably, for example, $1\times10^{16}$ cm$^{-3}$ or more and $1\times10^{19}$ cm$^{-3}$ or less, and more preferably $1\times10^{17}$ cm$^{-3}$ or more. Below the above range, the on-resistance may not decrease sufficiently. Also, exceeding the above range is difficult to achieve in terms of fabrication.

In the fabrication method according to the first embodiment, the second heat treatment is performed at 1300° C. or more and 1500° C. or less. Below the above range, the excitation of the $N_2$ molecules is insufficient and the VcNN structure is not formed. In addition, if the above range is exceeded, the $N_2$ molecule separates and becomes a single nitrogen atom and so, no VcNN structure is formed.

In the fabrication method according to the first embodiment, it is desirable that the oxygen partial pressure of the heat treatment for forming the VcNN structure be as low as possible. If oxygen is present during the heat treatment, oxidation of the front surface of the silicon carbide layer 10 proceeds and there is a possibility that the VcNN structure cannot be formed sufficiently. The oxygen partial pressure is 0.1 ppm or less and preferably 0.01 ppm or less.

In the fabrication method according to the first embodiment, high-temperature annealing is performed in an $N_2$ gas in a state where the front surface P1 of the silicon carbide layer 10 is exposed. Accordingly, penetration of excited $N_2$ molecules into the silicon carbide layer 10 is promoted. Therefore, the carbon vacancy Vc in the silicon carbide layer 10 can be changed to the VcNN structure.

In the fabrication method according to the first embodiment, from the viewpoint of forming the VcNN structure in the silicon carbide layer 10 up to a deep position of the silicon carbide layer 10, the total pressure during the heat treatment is preferably higher than the atmospheric pressure. By making the total pressure higher than the atmospheric pressure, penetration of excited $N_2$ molecules into the silicon carbide layer 10 is promoted.

FIG. 13 is a diagram showing the concentration distribution of elements in a modification of the semiconductor device according to the first embodiment. FIG. 13 shows the concentration distribution of nitrogen and p-type impurities in a cross section including the silicon carbide layer 10 and the anode electrode 34.

In the modification, the third nitrogen concentration of the contact region 20 is equal to or higher than the p-type impurity concentration of the contact region 20. In addition, the second nitrogen concentration of at least a portion of the anode region 16 is equal to or higher than the p-type impurity concentration of the anode region 16.

For example, when the density of the carbon vacancies Vc generated in the silicon carbide layer 10 during ion implantation to form the anode region 16 or the contact region 20 is high, the profile as in the modification is obtained. Since nitrogen in the VcNN structure is inactive as described above, the anode region 16 and the contact region 20 are maintained in the p-type.

According to the first embodiment, as described above, the PiN diode 100 with low on-resistance and the method for fabricating the PiN diode 100 are implemented.

Second Embodiment

A semiconductor device according to a second embodiment is different from the first embodiment in that the semiconductor device is a MOSFET. Hereinafter, descriptions of contents overlapping with the first embodiment will be omitted.

FIG. 14 is a schematic sectional view of a semiconductor device according to the second embodiment. The semiconductor device according to the second embodiment is a MOSFET 200. The MOSFET 200 is a double implantation MOSFET (DIMOSFET) in which a p-well and a source region are formed by ion implantation. Further, the MOSFET 200 is an n-channel type MOSFET using electrons as carriers.

The MOSFET 200 includes the silicon carbide layer 10, a drain region 112, a drift region 114 (n-type silicon carbide region), a p-well region 116 (first p-type silicon carbide region), a source region 118, a p-well contact region 120 (second p-type silicon carbide region), a gate insulating layer 128, a gate electrode 130, an interlayer insulating film 132, a source electrode 134 (first electrode), and a drain electrode 136 (second electrode). The drain region 112, the drift region 114, the p-well region 116, the source region 118, and the p-well contact region 120 are disposed in the silicon carbide layer 10.

The MOSFET 200 includes a PiN diode as a body diode. The drain region 112, the drift region 114 (n-type silicon carbide region), the p-well region 116 (first p-type silicon carbide region), the p-well contact region 120 (second p-type silicon carbide region), the source electrode 134 (first electrode), and the drain electrode 136 (second electrode) constitute a PiN diode.

The silicon carbide layer 10 is single crystal SiC. The silicon carbide layer 10 is, for example, 4H—SiC.

The drain region 112 is made of, for example, n$^+$-type SiC. The drain region 112 contains, for example, nitrogen (N) as an n-type impurity. The impurity concentration of the n-type impurity in the drain region 112 is, for example, $1\times10^{-18}$ cm$^{-3}$ or more and $1\times10^{20}$ cm$^{-3}$ or less.

The drift region 114 is disposed on the drain region 112. The drift region 114 is made of n$^-$-type SiC. The drift region 114 contains, for example, nitrogen as an n-type impurity.

The impurity concentration of the n-type impurity in the drift region 114 is, for example, $1\times10^{15}$ cm$^{-3}$ or more and $2\times10^{16}$ cm$^{-3}$ or less. The drift region 114 is, for example, an epitaxial growth layer of SiC formed by epitaxial growth on the drain region 112. The thickness of the drift region 14 is, for example, 5 μm or more and 100 μm or less.

The drift region 114 has a first nitrogen concentration. The first nitrogen concentration is a concentration including nitrogen that does not function as a dopant. The first nitrogen concentration is a concentration including inert nitrogen. The first nitrogen concentration is, for example, $1\times10^{15}$ cm$^{-3}$ or more and $2\times10^{16}$ cm$^{-3}$ or less.

The drift region 114 includes a VcNN structure.

The p-well region 116 is disposed on a portion of the front surface of the drift region 114. The p-well region 116 is made of p-type SiC. The p-well region 116 contains, for example, aluminum (Al) as a p-type impurity. The impurity concentration of the p-type impurity in the p-well region 116 is, for example, $5\times10^{15}$ cm$^{-3}$ or more and $1\times10^{18}$ cm$^{-3}$ or less.

The depth of the p-well region 116 is, for example, 0.4 μm or more and 0.8 μm or less. The p-well region 116 functions as a channel region of the MOSFET 200.

The front surface of the p-well region 116 is a face inclined at 0° to 8° with respect to the silicon face.

The p-well region 116 has a second nitrogen concentration. The second nitrogen concentration is higher than the first nitrogen concentration. The second nitrogen concentration is a concentration including nitrogen that does not function as a dopant. The second nitrogen concentration is a concentration including inert nitrogen. The second nitrogen concentration is, for example, $1\times10^{16}$ cm$^{-3}$ or more and $1\times10^{19}$ cm$^{-3}$ or less.

The p-well region 116 includes a VcNN structure. The density of the VcNN structure in the p-well region 116 is higher than that of the VcNN structure in the drift region 114.

The source region 118 is disposed on a portion of the front surface of the p-well region 116. The source region 118 is made of n$^+$-type SiC. The source region 118 contains, for example, phosphorus (P) as an n-type impurity. The impurity concentration of the n-type impurity in the source region 118 is, for example, $1\times10^{18}$ cm$^{-3}$ or more and $1\times10^{22}$ cm$^{-3}$ cm or less.

The depth of the source region 118 is shallower than that of the p-well region 116. The depth of the source region 118 is, for example, 0.2 μm or more and 0.4 μm or less.

The p-well contact region 120 is disposed on a portion of the front surface of the p-well region 116. The p-well contact region 120 is disposed beside the source region 118. The p-well contact region 120 is p$^+$-type SiC.

The p-well contact region 120 contains, for example, aluminum as a p-type impurity. The impurity concentration of the p-type impurity in the p-well contact region 120 is, for example, $1\times10^{19}$ cm$^{-3}$ or more and $1\times10^{22}$ cm$^{-3}$ or less.

The depth of the p-well contact region 120 is shallower than that of the p-well region 116. The depth of the p-well contact region 120 is, for example, 0.2 μm or more and 0.4 μm or less.

The p-well contact region 120 has a third nitrogen concentration. The third nitrogen concentration is higher than the second nitrogen concentration. The third nitrogen concentration is a concentration including nitrogen that does not function as a dopant. The third nitrogen concentration is a concentration including inert nitrogen. The third nitrogen concentration is, for example, $1\times10^{18}$ cm$^{-3}$ or more and $5\times10^{22}$ cm$^{-3}$ or less.

The p-well contact region 120 includes a VcNN structure. The density of the VcNN structure in the p-well contact region 120 is higher than that of the VcNN structure in the p-well region 116.

The gate insulating layer 128 is disposed between the p-well region 116 and the gate electrode 130 and between the drift region 114 and the gate electrode 130. The gate insulating layer 128 is made of, for example, silicon oxide. For example, silicon oxynitride or a high-k material can be applied to the gate insulating layer 128.

The thickness of the gate insulating layer 128 is, for example, 20 nm or more and 150 nm or less. The gate insulating layer 128 functions as a gate insulating layer of the MOSFET 200.

The gate electrode 130 is disposed on the gate insulating layer 128.

For example, polycrystalline silicon containing an n-type impurity or a p-type impurity can be applied to the gate electrode 130.

The interlayer insulating film 132 is formed on the gate electrode 130. The interlayer insulating film 132 is made of, for example, a silicon oxide film.

The source electrode 134 is electrically connected to the source region 118 and the p-well contact region 120. The source electrode 134 also functions as a p-well electrode for providing a potential to the p-well region 116. The source electrode 134 is in contact with the silicon carbide layer 10.

The source electrode 134 functions as an anode electrode of the body diode.

The source electrode 134 is constructed as a lamination of, for example, a barrier metal layer of Ni (nickel) and a metal layer of aluminum on the barrier metal layer. The barrier metal layer of nickel and the silicon carbide layer 10 may react to form nickel silicide (NiSi, $Ni_2Si$, etc.). The barrier metal layer of nickel and the metal layer of aluminum may form an alloy by reaction.

The drain electrode 136 is electrically connected to the drain region 112. The drain electrode 136 is disposed on the side of the rear surface P2 of the silicon carbide layer 10. The drain electrode 136 is in contact with the silicon carbide layer 10.

The drain electrode 136 functions as a cathode electrode of the body diode.

The drain electrode 136 is made of, for example, nickel. Nickel may react with the silicon carbide layer 10 to form nickel silicide (NiSi, $Ni_2Si$, etc.).

According to the second embodiment, as described above, the MOSFET 200 including a body diode with low on-resistance is implemented.

In the first and second embodiments, as described above, the case of 4H—SiC is described as an example of the crystal structure of silicon carbide, but the present disclosure can also be applied to silicon carbide of other crystal structures such as 6H—SiC and 3C—SiC.

While certain embodiments have been described, these embodiments have been presented by way of example only, and are not intended to limit the scope of the inventions. Indeed, a semiconductor device and a method for fabricating the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   a first electrode;
   a second electrode;
   a silicon carbide layer disposed between the first electrode and the second electrode;
   an n-type silicon carbide region disposed in the silicon carbide layer and having a first nitrogen concentration;
   a first p-type silicon carbide region disposed in the silicon carbide layer between the n-type silicon carbide region and the first electrode and having a second nitrogen concentration higher than the first nitrogen concentration; and
   a second p-type silicon carbide region disposed in the silicon carbide layer between the first p-type silicon carbide region and the first electrode, having a third nitrogen concentration higher than the second nitrogen concentration, and having a p-type impurity concentration higher than a p-type impurity concentration of the first p-type silicon carbide region.

2. The device according to claim 1, wherein the third nitrogen concentration is $1\times10^{18}$ $cm^{-3}$ or more and $5\times10^{22}$ $cm^{-3}$ or less.

3. The device according to claim 1, wherein the first nitrogen concentration is $1\times10^{15}$ $cm^{-3}$ or more and $2\times10^{16}$ $cm^{-3}$ or less.

4. The device according to claim 1, wherein the second p-type silicon carbide region has the p-type impurity concentration of $1\times10^{19}$ $cm^{-3}$ or more and $1\times10^{22}$ $cm^{-3}$ or less.

5. The device according to claim 1, wherein the second p-type silicon carbide region contains a structure including a first nitrogen atom bonded to two silicon atoms and a second nitrogen atom bonded to the first nitrogen atom and also bonded to two silicon atoms.

6. The device according to claim 5, wherein the first p-type silicon carbide region contains a structure including a first nitrogen atom bonded to two silicon atoms and a second nitrogen atom bonded to the first nitrogen atom and also bonded to two silicon atoms.

7. The device according to claim 6, wherein the n-type silicon carbide region contains a structure including a first nitrogen atom bonded to two silicon atoms and a second nitrogen atom bonded to the first nitrogen atom and also bonded to two silicon atoms.

8. The device according to claim 7, wherein a density of the structure of the second p-type silicon carbide region is higher than a density of the structure of the first p-type silicon carbide region and the density of the structure of the first p-type silicon carbide region is higher than a density of the structure of the n-type silicon carbide region.

9. The device according to claim 1, wherein two nitrogen atoms in the second p-type silicon carbide region are present at a carbon position of a silicon carbide crystal lattice.

10. The device according to claim 9, wherein two nitrogen atoms in the first p-type silicon carbide region are present at a carbon position of the silicon carbide crystal lattice.

11. The device according to claim 1, wherein the third nitrogen concentration is not less than the p-type impurity concentration of the second p-type silicon carbide region.

12. The device according to claim 11, wherein the second nitrogen concentration is not less than the p-type impurity concentration of the first p-type silicon carbide region.

13. A method for fabricating a semiconductor device comprising:
   forming a first p-type silicon carbide region by performing a first ion implantation of a p-type impurity from a side of a first plane into a silicon carbide layer having the first plane and a second plane;
   forming a second p-type silicon carbide region having a higher p-type impurity concentration than the first p-type silicon carbide region and having shallower depth than the first p-type silicon carbide region by performing a second ion implantation of the p-type impurity from the side of the first plane into the silicon carbide layer;
   performing first heat treatment at 1650° C. or more and 1900° C. or less;

performing second heat treatment at 1300° C. or more and 1500° C. or less in an $N_2$ gas having an oxygen partial pressure of 0.1 ppm or less in a state where the first plane is exposed;

forming a first electrode on the first plane; and forming a second electrode on the second plane.

14. The method according to claim 13, wherein a carbon film is formed on the first plane before the performing the first heat treatment, and the carbon film is removed before the performing the second heat treatment.

15. The method according to claim 13, wherein a film containing oxygen on the first plane is removed before the second heat treatment.

* * * * *